(12) United States Patent
Qu et al.

(10) Patent No.: US 11,127,764 B2
(45) Date of Patent: Sep. 21, 2021

(54) CIRCUIT SUBSTRATE, METHOD FOR MANUFACTURING THE SAME, DISPLAY SUBSTRATE AND TILED DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Lianjie Qu, Beijing (CN); Yonglian Qi, Beijing (CN); Hebin Zhao, Beijing (CN); Yun Qiu, Beijing (CN); Xiaoling Xu, Beijing (CN); Ruizhi Yang, Beijing (CN); Guangdong Shi, Beijing (CN); Shiyu Xu, Beijing (CN); Shan Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 16/703,045

(22) Filed: Dec. 4, 2019

(65) Prior Publication Data

US 2020/0312883 A1   Oct. 1, 2020

(30) Foreign Application Priority Data

Mar. 26, 2019   (CN) .......................... 201910231829.5

(51) Int. Cl.
*H01L 27/12*   (2006.01)
*H01L 21/027*   (2006.01)
(Continued)

(52) U.S. Cl.
CPC ........ *H01L 27/124* (2013.01); *H01L 21/0273* (2013.01); *H01L 21/486* (2013.01);
(Continued)

(58) Field of Classification Search
CPC ............. H01L 23/49805; H01L 21/486; H01L 25/167; H01L 27/1262; H01L 23/5386; H01L 27/156
See application file for complete search history.

(56) References Cited

U.S. PATENT DOCUMENTS

2020/0295119 A1* 9/2020 Yueh ................... H01L 27/3293

FOREIGN PATENT DOCUMENTS

| CN | 103065561 A | 4/2013 |
| CN | 203404572 U | 1/2014 |

(Continued)

OTHER PUBLICATIONS

First Office Action for Chinese Application No. 201910231829.5, dated Jul. 1, 2020, 7 Pages.

*Primary Examiner* — Changhyun Yi
(74) *Attorney, Agent, or Firm* — Brooks Kushman P.C.

(57) ABSTRACT

The present disclosure provides a circuit substrate, a method for manufacturing the same, a display substrate and a tiled display device. The circuit substrate includes: a base substrate; a driving circuit on the base substrate; and conductive connection portions. A plurality of grooves is defined in a lateral side of the base substrate; each of the plurality of grooves extends through a top surface and an opposite bottom surface of the base substrate. The driving circuit includes signal lines on the top surface of the base substrate and signal-line leads on the bottom surface of the base substrate. The plurality of conductive connection portions are corresponding to the plurality of grooves in a one-to-one manner; at least one part of the conductive connection portion is in the corresponding groove. The conductive connection portion is connected with the corresponding signal line and the corresponding signal-line lead, respectively.

17 Claims, 8 Drawing Sheets

(51) Int. Cl.
*H01L 21/48* (2006.01)
*H01L 23/13* (2006.01)
*H01L 23/538* (2006.01)
*H01L 25/16* (2006.01)

(52) U.S. Cl.
CPC .......... *H01L 23/13* (2013.01); *H01L 23/5386* (2013.01); *H01L 25/167* (2013.01); *H01L 27/1218* (2013.01); *H01L 27/1262* (2013.01); *H01L 27/1288* (2013.01)

(56) References Cited

FOREIGN PATENT DOCUMENTS

| | | |
|---|---|---|
| CN | 105789225 A | 7/2016 |
| CN | 206115896 U | 4/2017 |
| CN | 107393434 A | 11/2017 |
| CN | 206674336 U | 11/2017 |
| CN | 107645832 A | 1/2018 |

* cited by examiner

CIRCUIT SUBSTRATE, METHOD FOR MANUFACTURING THE SAME, DISPLAY SUBSTRATE AND TILED DISPLAY DEVICE

CROSS-REFERENCE TO RELATED APPLICATION

This application claims the benefit and priority of Chinese Application No. 201910231829.5, filed on Mar. 26, 2019, the disclosure of which is incorporated in its entirety by reference herein.

TECHNICAL FIELD

The present disclosure relates to the field of displaying technologies, and in particular, to a circuit substrate, a method for manufacturing the same, a display substrate and a tiled display device.

BACKGROUND

With continuous development of displaying technologies, new displaying technologies such as Micro Light-Emitting Diode (LED) and mini LED have been widely used in the field of backlight. However, current products including micro LED or mini LED have poor reliability.

SUMMARY

According to a first aspect of the present disclosure, a circuit substrate is provided and includes: a base substrate; a driving circuit on the base substrate; and conductive connection portions. A plurality of grooves is defined in a lateral side of the base substrate; each of the plurality of grooves extends through a top surface and an opposite bottom surface of the base substrate. The driving circuit includes signal lines on the top surface of the base substrate and signal-line leads on the bottom surface of the base substrate. The plurality of conductive connection portions are corresponding to the plurality of grooves in a one-to-one manner; at least one part of the conductive connection portion is in the corresponding groove. The conductive connection portion is connected with the corresponding signal line and the corresponding signal-line lead, respectively.

In one embodiment, each of the plurality of grooves extends in a direction perpendicular to the base substrate.

In one embodiment, the conductive connection portion includes: a first part in the groove, a second part connected with the first part and located on the top surface of the base substrate, and a third part connected with the first part and located on the bottom surface of the base substrate; the second part is connected with the corresponding signal line, and the third part is connected with the corresponding signal-line lead.

In one embodiment, in a direction parallel to the base substrate, a maximum thickness of the first part is less than or equal to a maximum depth of the groove.

In one embodiment, a shape of a cross section of the groove in a plane substantially parallel to the top surface of the base substrate is C shaped.

In one embodiment, a shape of a cross section of the groove in a plane substantially parallel to the top surface of the base substrate is semi-circular.

In one embodiment, the driving circuit further includes a thin film transistor array layer on the top surface of the base substrate; and the signal lines and the signal-line leads configured to provide control signals for the thin film transistor array layer.

In one embodiment, the base substrate is a glass substrate or a polyimide substrate.

According to a second aspect of the present disclosure, a display substrate is provided and includes: a circuit substrate; and a plurality of micro light emitting diodes on the circuit substrate. The circuit substrate is configured to drive the plurality of micro light emitting diodes to emit light; and the circuit substrate includes: a base substrate; a driving circuit on the base substrate and coupled with the plurality of micro light emitting diodes; and conductive connection portions. A plurality of grooves is defined in a lateral side of the base substrate; each of the plurality of grooves extends through a top surface and an opposite bottom surface of the base substrate. The driving circuit includes signal lines on the top surface of the base substrate and signal-line leads on the bottom surface of the base substrate. The plurality of conductive connection portions are corresponding to the plurality of grooves in a one-to-one manner; at least one part of the conductive connection portion is in the corresponding groove. The conductive connection portion is connected with the corresponding signal line and the corresponding signal-line lead, respectively.

According to a third aspect of the present disclosure, a tiled display device is provided and includes the above display substrate.

According to a fourth aspect of the present disclosure, a method for manufacturing the above circuit substrate is provided and includes: providing a base-substrate motherboard; fabricating a driving circuit on the base-substrate motherboard, wherein the driving circuit includes signal lines on a top surface of the base-substrate motherboard and signal-line leads on an opposite bottom surface of the base-substrate motherboard; fabricating a plurality of via-holes extending through the base-substrate motherboard; wherein each of the plurality of via-holes is in a preset cutting line; fabricating a conductive connection portion at an inner circumferential wall of each of the plurality of via-holes; wherein the conductive connection portion is connected with the corresponding signal line and the corresponding signal-line lead, respectively; and cutting the base-substrate motherboard in which the conductive connection portion is fabricated, along the cutting line, thereby forming a plurality of separate circuit substrates.

In one embodiment, the step of fabricating a driving circuit on the base-substrate motherboard, further includes: fabricating a thin film transistor array layer on the top surface of the base-substrate motherboard; wherein the signal lines and the signal-line leads are configured to provide control signals for the thin film transistor array layer, thereby enabling output electrodes of thin film transistors included in the thin film transistor array layer to output driving signals.

In one embodiment, the step of fabricating a conductive connection portion at an inner circumferential wall of each of the plurality of via-holes, includes: forming a photoresist film completely covering the base-substrate motherboard; patterning the photoresist film to form a photoresist reserved region and a photoresist removal region; wherein the photoresist removal region corresponds to a region where the conductive connection portion is located, and the photoresist reserved region corresponds to other region except for the region where the conductive connection portion is located; depositing a conductive material in the photoresist removal region; and removing the photoresist film in the photoresist reserved region, thereby forming the conductive connection portion at the inner circumferential wall of each of the plurality of via-holes.

In one embodiment, the step of fabricating a conductive connection portion at an inner circumferential wall of each of the plurality of via-holes, includes: forming a first conductive material layer completely covering the base-substrate motherboard; forming a photoresist film completely covering the first conductive material layer; patterning the photoresist film to form a photoresist reserved region and a photoresist removal region; wherein the photoresist removal region corresponds to a region where the conductive connection portion is located, and the photoresist reserved region corresponds to other region except for the region where the conductive connection portion is located; forming a second conductive material layer in the photoresist removal region; removing the photoresist film in the photoresist reserved region; and, removing the first conductive material layer in the photoresist reserved region, thereby forming the conductive connection portion at the inner circumferential wall of each of the plurality of via-holes.

In one embodiment, in the step of cutting the base-substrate motherboard in which the conductive connection portion is fabricated, along the cutting line, each of the plurality of via-holes in the preset cutting line is divided into two grooves.

In one embodiment, a shape of a cross section of the groove in a plane substantially parallel to the top surface of the base substrate is C shaped.

In one embodiment, a shape of a cross section of the groove in a plane substantially parallel to the top surface of the base substrate is semi-circular.

BRIEF DESCRIPTION OF THE DRAWINGS

The accompanying drawings, which are incorporated in and constitute a part of this specification, illustrate embodiments consistent with the invention and, together with the description, serve to explain the principles of the invention, and are not intended to limit the scope of the inventive concept in any way.

DETAILED DESCRIPTION

In order to further illustrate a circuit substrate and a method for manufacturing the same, a display substrate and a tiled display device according to embodiments of the present disclosure, detailed description will be made herein in conjunction with the accompanying drawings.

No matter whether micro LEDs and mini LEDs are used for backlighting in liquid crystal display devices or large-size TVs, they are usually integrated on printed circuit substrates (PCBs), and are driven to emit light in a passive drive mode. Although this can realize normal backlight function, there are still some defects in dynamic local backlight brightness adjustment, reliability, power consumption and the like. In order to solve the above problems, it is considered to employ a glass substrate, that is, the Micro LED and the mini LED are integrated on the glass substrate. However, when the glass substrate is employed, due to the poor processing performance of the glass substrate, the glass substrate is easy to be broken and cracked in the process of drilling holes with high density and high precision in an entire surface of the glass substrate. Then, in order to avoid drilling holes in the glass substrate, it is considered to form a conductive connection portion for connecting upper and lower surfaces of the glass substrate on a lateral side of the glass substrate. However, when the glass substrate of such a structure is used for a tiled display device, the conductive connection portion on the lateral side of the glass substrate is easily worn during movement of the glass substrate, resulting in a problem of reduced reliability of products.

Figure 1:
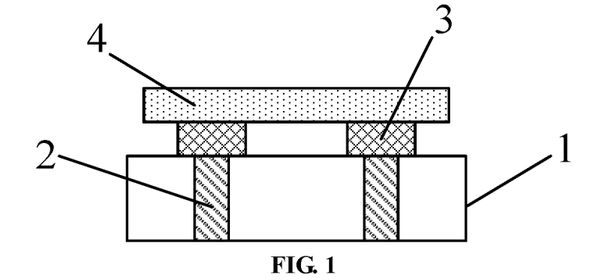
FIG. 1 is a schematic view showing a micro light emitting diode mounted on a glass substrate in the related art.
Figure 2:
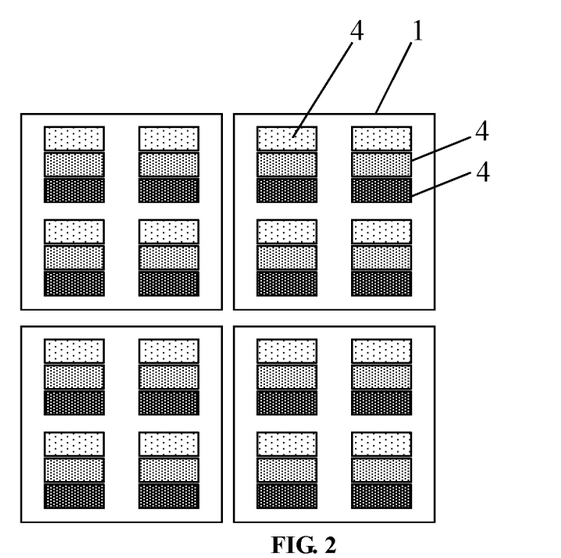
FIG. 2 is schematic view of a tiled substrate in the related art.

In view of the above problems, the inventors of the present disclosure have found through research that, when a transparent substrate such as a glass substrate is employed, as shown in FIG. 1 and FIG. 2, it is considered to first form a via-hole in the transparent substrate such as the glass substrate 1, then form a conductive portion such as Cu pillar 2 in the via-hole by means of electroforming and from a bonding pad 3 on the Cu pillar 2, and finally mount a micro light emitting diode 4 such as a Micro LED or a mini LED, on the bonding pad 3. Although this method can ensure good electrical conductivity of the via-hole formed in the glass substrate, there are two main problems that are difficult to overcome in practical applications. One problem is that high-density via-holes make it difficult to process the glass substrate. For example, a diameter of a via-hole formed by laser drilling is between 50 um and 100 um, and a size of the Micro LED and mini LED in the related art is between 50 um and 200 um. Then, when the glass substrate 1 is used to prepare a backlight substrate or a display substrate of the Micro LED or the mini LED, it means that via-holes are in most of the area of the glass substrate. The glass substrate 1 of such structure cannot be used. The other problem is that the reliability of the product is seriously affected by compression or separation between the Cu column 2 and the via-holes in the glass substrate as the temperature changes in practical application, since Cu has a linear thermal expansion coefficient of $1.7 \times 10^{-5}$/K, which is several times of a linear thermal expansion coefficient of $(3.3 \pm 0.1) \times 10^{-6}$/K of glass.

Figure 3:
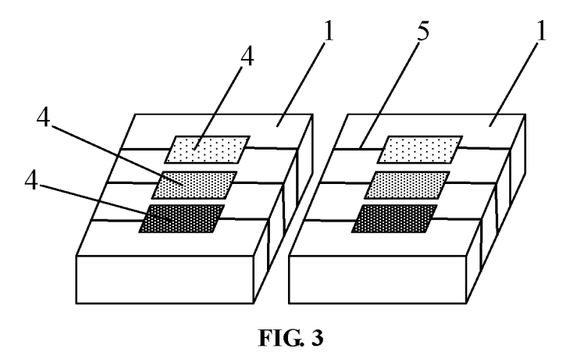
FIG. 3 is another schematic view showing micro light emitting diodes mounted on glass substrates in the related art.
Figure 4:
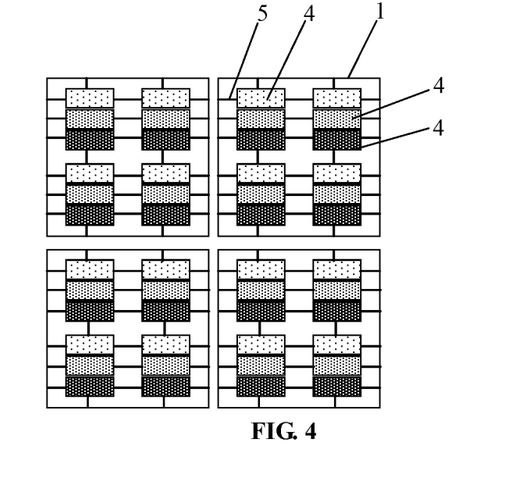
FIG. 4 is another schematic view of a tiled substrate in the related art.

In addition, the inventors of the present disclosure have also found that it is considered to form a metal trace 5 on a lateral side of the glass substrate 1 to achieve communication between a top surface and a bottom surface of the glass substrate 1. Specifically, as shown in FIG. 3 and FIG. 4, by forming the metal trace 5 on the lateral side of the glass substrate 1, a micro light emitting diode 4 on the top surface of the glass substrate 1 can be connected to a driving portion on the bottom surface of the glass substrate 1. This method can avoid formation of high-density via-holes in the glass substrate and the problem of big difference in the thermal expansion coefficients of Cu and the glass substrate 1. However, this method still has some problems, one of which is that the lateral trace of the glass substrate 1 is completely protruding out and the lateral trace may be damaged when relative movement between splicing blocks occurs in a splicing process. Another problem is that the process of forming the lateral metal traces 5 is immature, and the immature scheme brings great uncertainty to the performance of the product.

In view of the problems existed in the above schemes, the inventors of the present disclosure have further found that a groove extending through the top and bottom surfaces of the glass substrate can be formed in the lateral side of the glass substrate, and then the metal trace 5 is formed in the groove. This not only avoids formation of via-holes in a large area of the surface of the glass substrate, but also solves the problem that due to the poor processing performance of the glass substrate, the glass substrate is easy to be broken and cracked in the process of drilling holes with high precision. Further, in the splicing process, even if the relative movement between the splicing blocks occurs, the lateral trace will not be damaged.

Figure 5:
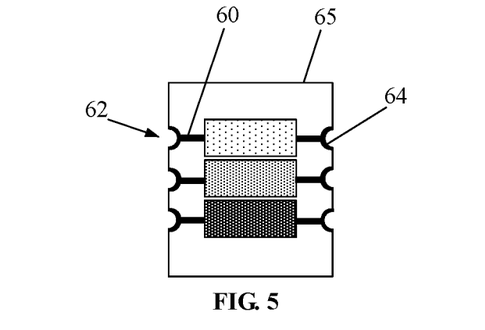
FIG. 5 is a schematic view of micro light emitting diodes mounted on a circuit substrate according to an embodiment of the present disclosure.
Figure 6:
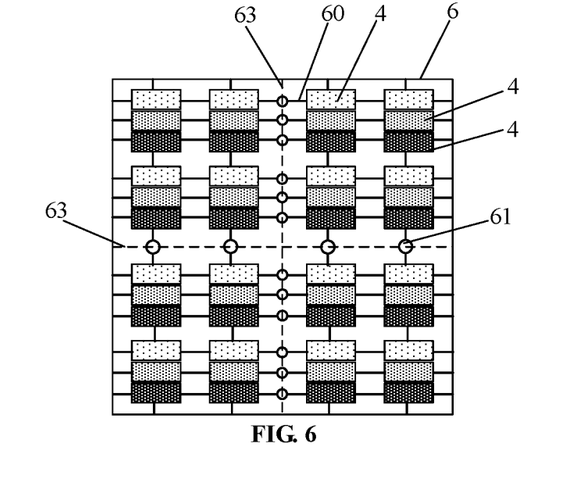
FIG. 6 is a schematic view of mounting micro light emitting diodes on a motherboard according to an embodiment of the present disclosure.

Specifically, referring to FIG. 5 and FIG. 6, one embodiment of the present disclosure provides a circuit substrate. The circuit substrate includes: a base substrate 65, a driving circuit on the base substrate 65 and conductive connection portions 64.

Figure 14:
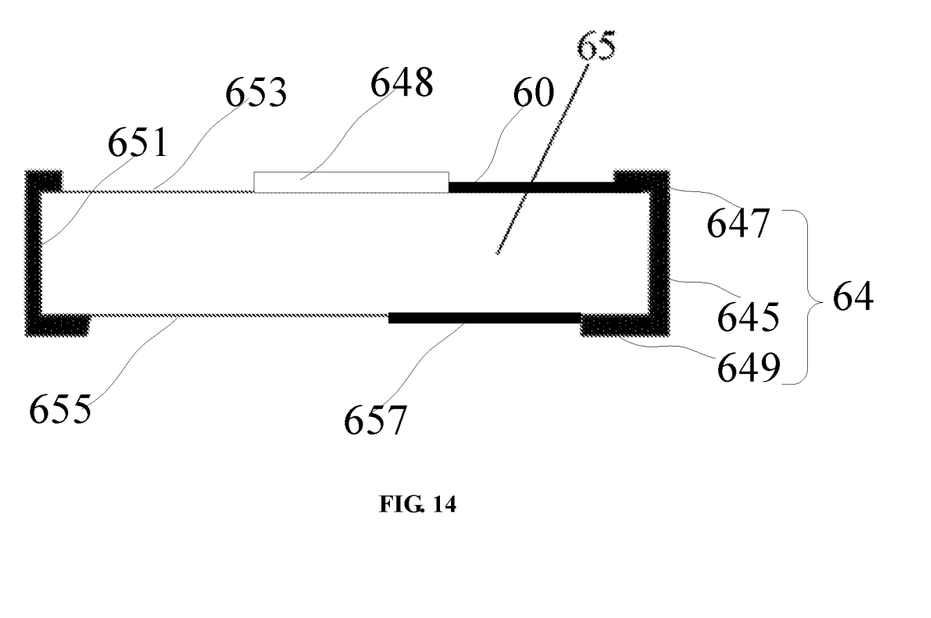
FIG. 14 is a schematic view of a circuit substrate according to an embodiment of the present disclosure.

A plurality of grooves 62 is defined in a lateral side 651 (as shown in FIG. 14) of the base substrate 65. Each groove 62 extends in a direction perpendicular to the base substrate 65 (for example, when the circuit substrate is at a position shown in FIG. 5, each groove 62 extends in a direction perpendicular to the paper), and extends through a top surface 653 (as shown in FIG. 14) and an opposite bottom surface 655 (as shown in FIG. 14) of the base substrate 65.

The driving circuit includes signal lines 60 on the top surface of the base substrate 65 and signal-line leads 657 (as shown in FIG. 14) on the bottom surface of the base substrate 65.

The conductive connection portions 64 are corresponding to the grooves 62 in a one-to-one manner. At least one part of the conductive connection portion 64 is in the corresponding groove 62. The conductive connection portion 64 is connected with the corresponding signal line 60 and the corresponding signal-line lead, respectively.

Specifically, the base substrate 65 may be of various types, such as a glass substrate or a polyimide substrate. After the suitable base substrate 65 is selected, the grooves 62 may be formed in the lateral side of the base substrate 65. The groove 62 extends in the direction perpendicular to the base substrate 65 and extends through the opposite top and bottom surfaces of the base substrate 65. A groove bottom and two opposite sidewalls of the groove 62 are defined by the lateral side of the base substrate 65. The size of the groove 62 may be set according to actual needs, as long as the groove can accommodate the conductive connection portion disposed therein. In one embodiment, a shape of a cross section of the groove 62 in a plane substantially parallel to the top surface of the base substrate is C shaped, for example, semi-circular.

The material of the conductive connection portions 64 disposed in the groove 62 may be selected according to actual needs, as long as the material has good electrical conductivity. For example, the conductive connection portion 64 may be made of metal material. Specifically, the conductive connection portion 64 may be formed by depositing metal material of a certain thickness on the sidewall of the groove 62 by means of electroplating, plasma enhanced chemical vapor deposition or sputtering.

The above driving circuit on the base substrate 65 may specifically include the signal lines 60 on the top surface of the base substrate 65 and signal-line leads on the bottom surface of the base substrate 65. For example, the signal lines 60 are corresponding to the conductive connection portions 64 in the grooves 62 in a one-to-one manner, and the signal-line leads are corresponding to the conductive connection portions 64 in the grooves 62 in a one-to-one manner. The signal line 60 is connected with an end of the corresponding conductive connection portion 64 on the top surface, and the signal-line lead is connected with an end of the corresponding conductive connection portion 64 on the bottom surface. In this way, an electrical connection between the signal line 60 and the corresponding signal-line lead is achieved by the corresponding conductive connection portion 64. It should be noted that the signal-line lead may be disposed on the bottom surface of the base substrate 65 in the same or similar manner as the signal line 60, as shown in FIG. 14.

In the actual application, micro light emitting diodes 4 may be formed on one side of the circuit substrate, and the top surface of the base substrate 65 is also located at the one side of the circuit substrate. The driving circuit is coupled with the micro light emitting diodes 4. The driving circuit is provided with a control signal through the signal lines 60 and the signal-line leads, so that the driving circuit can generate a driving signal capable of driving the micro light emitting diodes 4, thereby driving the micro light emitting diodes 4 to emit light. It should be noted that the above circuit substrate may be used to drive the micro light emitting diodes 4, and may also be applied to a liquid crystal display device or an organic light emitting diode display device.

According to the specific structure and practical application mode of the circuit substrate provided in above embodiments, in the circuit substrate provided in the embodiment of the present disclosure, a plurality of grooves 62 extending through the top and bottom surfaces of the base substrate 65 is defined in the lateral side of the base substrate 65. The presence of the conductive connection portion 64 in the groove 62 can connect the signal line 60 on the top surface of the base substrate 65 with the signal-line lead on the bottom surface of the base substrate 65, thereby achieving signal transmission between the signal line 60 and the signal-line lead. It can be seen that no via-hole is defined in an inside area of the base substrate 65, and thus the type of the selected base substrate 65 is not limited by the processing performance. For example, a glass substrate or a polyimide substrate may be selected. Further, the conductive connection portion 64 which connects the signal line 60 with the signal-line lead, is disposed in the groove 62 in the lateral side of the base substrate 65, thus, even if relative movement between circuit substrates occur in the process of splicing the circuit substrates, there is no friction between the conductive connection portions 64 located in the corresponding grooves 62 of different circuit substrates, thereby preventing damage to the conductive connection portions 64.

It can be seen that in the circuit substrate provided in the embodiment of the present disclosure, when the base substrate 65 employs the glass substrate, an active driving scheme may be realized when the driving circuit is formed on the glass substrate due to high flatness of the glass substrate, thereby reducing overall volume of the circuit substrate and further reducing power consumption of the circuit substrate. Further, the circuit substrate made of the glass substrate has good resistance to water and oxygen corrosion, thereby improving service life and reliability of the circuit substrate. Therefore, when the circuit substrate provided in the embodiment of the present disclosure is used for preparing a backlight substrate or a display substrate of the Micro LED or the mini LED, not only the resolution of the backlight substrate or the display substrate of the Micro LED or the mini LED can be satisfied, but also the dynamic local backlight brightness adjustment can be realized when the circuit substrate provided in the embodiment of the present disclosure is used for preparing the backlight substrate of the Micro LED or the mini LED. In this way, the contrast of a display device including the backlight substrate is greatly improved.

In summary, in the circuit substrate provided in the embodiment of the present disclosure, when the glass substrate is used as a base substrate, in addition to the beneficial effects brought by the glass substrate, no via-hole is defined in an inner area of the glass substrate, thereby overcoming problem that the glass substrate is easy to be broken and cracked in the process of drilling holes with high precision due to the poor processing performance of the glass substrate.

In some embodiments, the conductive connection portion 64 provided in the above embodiment includes: a first part 645 (as shown in FIG. 14) located in the groove 62, a second part 647 connected with the first part and located on the top surface of the base substrate 65, and a third part 649 connected with the first part and located on the bottom surface of the base substrate 65. The second part is connected with the corresponding signal line 60. The third part is connected with the corresponding signal-line lead. In a direction parallel to the base substrate 65, a maximum thickness of the first part is less than or equal to a maximum depth of the groove 62.

Specifically, when fabricating the above conductive connection portion 64, the first part of the conductive connection portion 64 may be fabricated in the groove 62; the second part may be fabricated on the top surface of the base substrate 65 with the second part being connected with the first part; and the third part may be fabricated on the bottom surface of the base substrate 65 with the third part being connected with the first part. The thickness of the first part, the second part and the third part may be set according to actual needs. For example, the thickness of the second part in the direction perpendicular to the base substrate 65, the thickness of the third part in the direction perpendicular to the base substrate 65, and the maximum thickness of the first part in the direction parallel to the base substrate 65, are equal to each other. Or, the thickness of the second part in the direction perpendicular to the base substrate 65 is equal to the thickness of the third part in the direction perpendicular to the base substrate 65, and the thickness of the second part in the direction perpendicular to the base substrate 65 is greater than the maximum thickness of the first part in the direction parallel to the base substrate 65.

It is should be noted that when the thickness of the second part in the direction perpendicular to the base substrate 65 is equal to the thickness of the third part in the direction perpendicular to the base substrate 65, and the thickness of the second part in the direction perpendicular to the base substrate 65 is greater than the maximum thickness of the first part in the direction parallel to the base substrate 65, better connection can be provided between the second part and the signal line 60, and between the third part and the signal-line lead, thereby better ensuring signal transmission between the signal line 60 and the signal-line lead.

In addition, the maximum thickness of the first part in the direction parallel to the base substrate 65 may set to be less than the maximum depth of the groove 62, and this enables the first part to be better attached within the grooves, thereby further reducing the risk of easy separation of the first part of the conductive connection portion 64 and the glass substrate as the temperature changes due to different linear thermal expansion coefficients of the conductive connection portion 64 and the glass substrate, and then ensuring the reliability of the circuit substrate in practical application. When the maximum thickness of the first part in the direction parallel to the base substrate 65 is set to be equal to the maximum depth of the groove 62, the first part has a larger size, which not only improves signal transmission performance of the first part, but also better ensure connection between the first part and the second part, and between the first part and the third part.

In the above embodiment, the conductive connection portion 64 includes the first part, the second part, and the third part, so that the conductive connection portion 64 may be connected with the signal line 60 through the second part, and may be connected with the signal-line lead through the third part. Since the second part and the signal line 60 are both on the top surface of the base substrate 65 and the third part and the signal-line lead are both on the bottom surface of the base substrate 65, better connection can be provided between the signal line 60 and the second part, and between the signal-line lead and the third part. In this way, in practical applications, it is not easy to break between the signal line 60 and the conductive connection portion 64, and between the signal-line lead and the conductive connection portion 64.

In some embodiments, the driving circuit provided in the above embodiment further includes a thin film transistor array layer 648 (as shown in FIG. 14) on the top surface of the base substrate 65. The signal line 60 and the signal-line lead are used to provide corresponding control signals for the thin film transistor array layer, so that output electrodes of various thin film transistors included in the thin film transistor array layer output driving signals.

Specifically, the thin film transistor array layer may specifically include a light shielding layer, an active layer, a gate insulating layer, a gate, a dielectric layer, a source, a drain, a planarization layer and an anode. The active layer, the gate insulating layer, the gate, the dielectric layer, the source and the drain form a thin film transistor. The source or the drain may serve as an output electrode of the thin film transistor, and may be connected with the anode through a via-hole in the planarization layer. The anode may be used as a bonding pad for subsequent mounting of the Micro LED or the mini LED. The thin film transistor array layer may further include a common electrode. The common electrode may serve as another bonding pad for subsequent mounting of the Micro LED or the mini LED. It should be noted that when fabricating the thin film transistor array layer, it is necessary to reserve bonding pads of sufficient height and size for subsequent mounting of the Micro LED or the mini LED.

When fabricating the thin film transistor array layer of the above structure, the signal line 60 and the signal-line lead may be used to provide a corresponding control signal for the thin film transistor array layer. When the signal line 60 is connected with the gate included in the thin film transistor array layer, the signal line 60 is used to provide a scanning signal for the gate. When the signal line 60 is connected with the source or the drain which is included in the thin film transistor array layer and is not used as an output electrode, the signal line 60 is used to provide a data signal for the source or the drain.

When fabricating the thin film transistor array layer, the signal line 60 and the signal-line lead, a process flow commonly used in the related art may be employed, and the process flow may be the same as the process flow of the low temperature polysilicon driving circuit with high carrier mobility in an array substrate included in a current liquid crystal display device.

One embodiment of the present disclosure further provides a display substrate, including the circuit substrate provided in the above embodiment. The display substrate further includes a plurality of micro light emitting diodes 4 on the circuit substrate. The circuit substrate is used to drive the plurality of micro light emitting diodes 4 to emit light.

Specifically, the micro light emitting diodes 4 may be formed on the above circuit substrate in various ways. For example, the micro light emitting diodes 4 may be mounted on the circuit substrate by using a roll-to-flatbed printer or a chip bonding device. It should be noted that when the micro light emitting diodes 4 are mounted on the circuit substrate, bonding pads of the micro light emitting diodes 4, and bonding pads for mounting the micro light emitting diodes 4 of the circuit substrate are required to have good adhesion.

When the display substrate is in operation, the circuit substrate provides a driving signal for the plurality of micro light emitting diodes 4, thereby driving the plurality of micro light emitting diodes 4 to emit light.

In the circuit substrate provided in the above embodiment of the present disclosure, the type of the selected base substrate 65 is not limited by the processing performance, and the conductive connection portion 64 connecting the signal line 60 with the signal-line lead is disposed in the groove 62 in the lateral side of the base substrate 65. Thus, when the display substrate provided in the above embodiment of the present disclosure includes the above circuit substrate, even if relative movement between display substrates occur in the process of splicing the display substrates, there is no friction between the conductive connection portions 64 located in the corresponding grooves 62 of the circuit substrates of different display substrates, thereby preventing damage to the conductive connection portions 64 and improving the reliability of the display substrate.

In addition, when the base substrate 65 of the circuit substrate employs the glass substrate, the circuit substrate can realize an active driving scheme, thereby reducing overall volume of the circuit substrate and further reducing power consumption of the circuit substrate. Further, the circuit substrate made of the glass substrate has good resistance to water and oxygen corrosion, thereby improving service life and reliability of the circuit substrate. Therefore, when the display substrate provided in the embodiment of the present disclosure includes the above circuit substrate, not only the above beneficial effects can be achieved, but also higher resolution can be achieved.

One embodiment of the present disclosure further provides a tiled display device including a plurality of connected display substrates as described in the above embodiments.

In the circuit substrate included in the above display substrate, the type of the selected base substrate 65 is not limited by the processing performance, and the conductive connection portion 64 connecting the signal line 60 with the signal-line lead is disposed in the groove 62 in the lateral side of the base substrate 65. Thus, when the tiled display device provided in the embodiment of the present disclosure includes a plurality of connected display substrates, even if relative movement between display substrates occur, there is no friction between the conductive connection portions 64 located in the corresponding grooves 62 of the circuit substrates of different display substrates, thereby preventing damage to the conductive connection portions 64 and improving the reliability of the tiled display device.

In addition, when the base substrate 65 of the circuit substrate included in the above display substrate employs the glass substrate, the circuit substrate can realize an active driving scheme, thereby reducing overall volume of the circuit substrate and further reducing power consumption of the circuit substrate. Further, the circuit substrate made of the glass substrate has good resistance to water and oxygen corrosion, thereby improving service life and reliability of the circuit substrate. Therefore, when the tiled display device provided in the embodiment of the present disclosure includes the above display substrates, not only the above beneficial effects can be achieved, but also higher resolution can be achieved.

It should be noted that the tiled display device may be any product or component having a display function, such as a television, a monitor, a digital photo frame, and the like.

Figure 7:
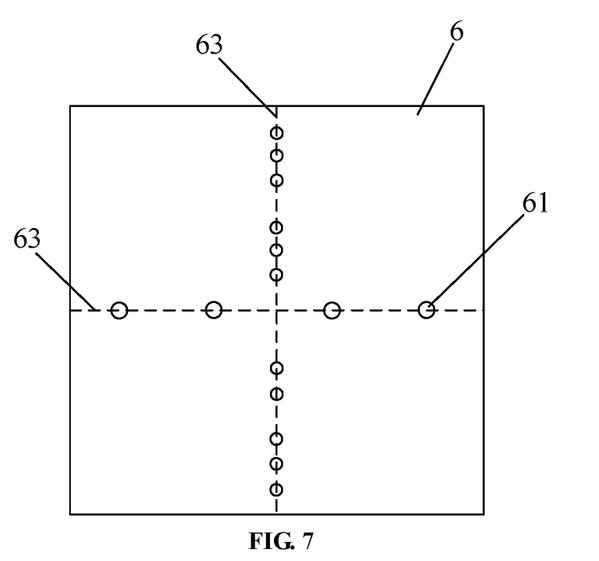
FIG. 7 is a schematic view of forming via-holes in the motherboard according to an embodiment of the present disclosure.
Figure 8:
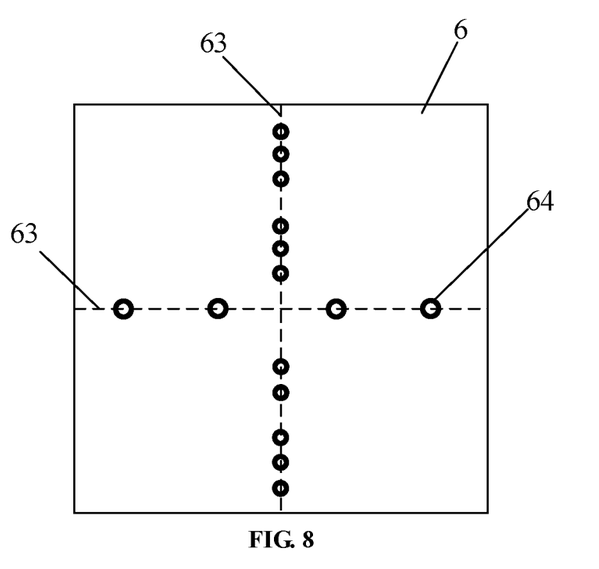
FIG. 8 is a schematic view of forming conductive connection portions in the via-holes according to an embodiment of the present disclosure.
Figure 9:
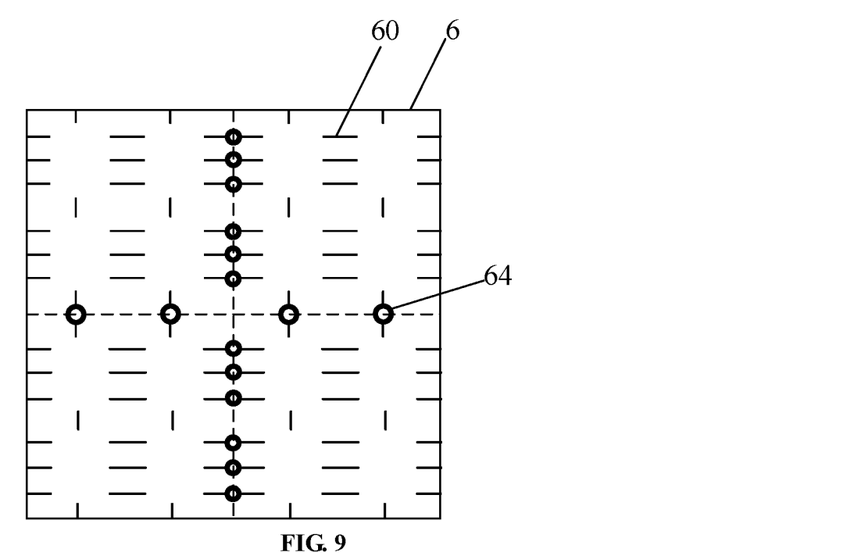
FIG. 9 is a schematic view of forming signal lines on the motherboard according to an embodiment of the present disclosure.
Figure 10:
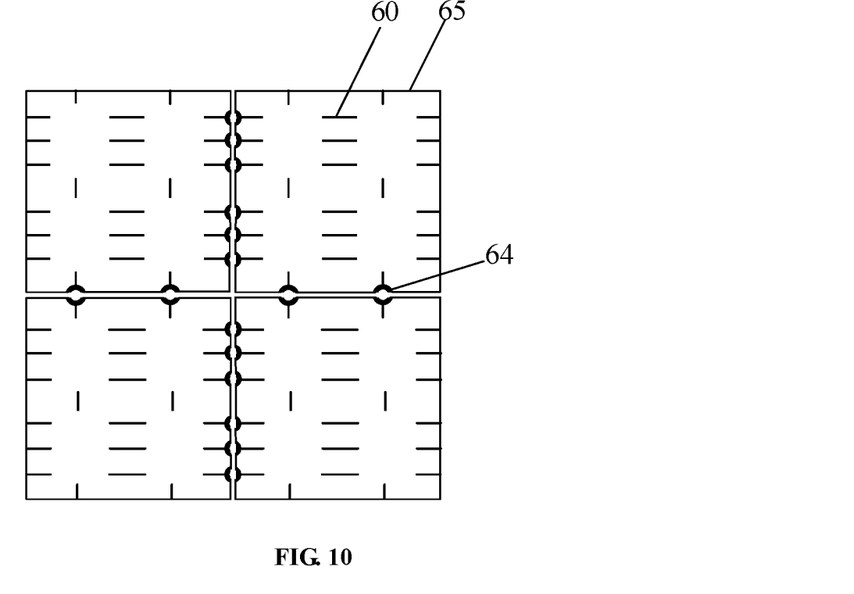
FIG. 10 is a schematic view of cutting the motherboard according to an embodiment of the present disclosure.

One embodiment of the present disclosure further provides a method for manufacturing a circuit substrate, which is used to manufacture the circuit substrate provided in the above embodiment. As shown in FIG. 7 to FIG. 11, the method includes:

providing a base-substrate motherboard 6;

fabricating a driving circuit on the base-substrate motherboard 6, where the driving circuit includes signal lines 60 on a top surface of the base-substrate motherboard 6 and signal-line leads on an opposite bottom surface of the base-substrate motherboard 6;

fabricating a plurality of via-holes 61 extending through the base-substrate motherboard 6; where each via-hole 61 is in a preset cutting line 63;

fabricating a conductive connection portion 64 at an inner circumferential wall of each via-hole 61 in the cutting line 63; where the conductive connection portion 64 is connected with the corresponding signal line 60 and the corresponding signal-line lead, respectively;

cutting the base-substrate motherboard 6 in which the conductive connection portion 64 is fabricated, along the cutting line 63, with each via-hole 61 in the cutting line 63 being divided into two grooves 62; where the two grooves 62 are located at two sides of the cutting line 63, respectively, and the conductive connection portion 64 in each via-hole 61 is divided into portions which are in the two grooves 62 respectively, thereby forming a plurality of separate circuit substrates.

Specifically, when fabricating the circuit substrate, the type of the base-substrate motherboard 6 may be a glass substrate or a polyimide substrate. The base-substrate motherboard 6 may be provided with the preset cutting line 63. The number and distribution of the preset cutting lines 63 may be set according to actual needs. For example, two cutting lines 63 which are perpendicular to each other, may be included. When the base-substrate motherboard 6 is cut along the two cutting lines 63, the base-substrate motherboard 6 can be cut into four rectangular base-substrate sub-boards of the same size.

After the base-substrate motherboard 6 is provided, a driving circuit may be fabricated on the base-substrate motherboard 6. The driving circuit may specifically include the signal lines 60 on the top surface of the base-substrate motherboard 6 and signal-line leads on the bottom surface of the base-substrate motherboard 6. Materials of the signal line 60 and the signal-line lead may be selected according to actual needs, for example, metal conductive material. In addition, each of the signal line 60 and the signal-line lead may be made of the same material as other conductive film layer of the driving circuit, which is in a same layer as each of the signal line and the signal-line lead. In this way, the signal line 60, and other conductive film layer which is in a same layer as the signal line 60, may be simultaneously formed by one patterning process; the signal-line lead, and other conductive film layer which is in a same layer as the signal-line lead, may be simultaneously formed by one patterning process.

The via-holes 61 may be formed in the base-substrate motherboard 6 in various way. For example, the via-holes 61 may be formed by laser irradiation or patterning with a mask plate. Currently, a thickness of the base-substrate motherboard 6 is generally 0.5 mm, and a diameter of the via-hole 61 formed in the base-substrate motherboard of such thickness by laser irradiation may be between 50 um and 100 um. When a thinner base-substrate motherboard 6 is employed, such as a base-substrate motherboard 6 having a thickness of 0.2 mm or 0.1 mm, a smaller via-hole 61 may be obtained. In addition, a position of the via-hole 61 is formed in the cutting line 63 of the base-substrate motherboard 6, that is, in a direction perpendicular to the base-substrate motherboard 6, each via-holes 61 partially overlaps the cutting line 63, and can be divided by the cutting line 63 into two grooves 62 which are located on opposite sides of the cutting line 63, respectively. In this way, when subsequently cutting the base-substrate motherboard 6 along the cutting line 63, each via-hole 61 is divided into two grooves each serving as a groove 62 in a lateral side of the corresponding base-substrate sub-board after cutting. The groove 62 extends through top and bottom surfaces of the base-substrate sub-board.

As shown in FIG. 8, the conductive connection portions 64 which are corresponding to the grooves 62 in a one-to-one manner, may be formed. At least one part of the conductive connection portion 64 is located in the corresponding groove 62. The conductive connection portion 64 is connected with the corresponding signal lines 60 and the corresponding signal-line lead, respectively. The conductive connection portion 64 may be formed in a variety of ways. For example, the conductive connection portion 64 may be formed in the via-hole 61 by plating copper on a sidewall of the via-hole 61. More specifically, the conductive connection portion 64 may be formed by depositing metal material such as copper of a certain thickness on the sidewall of the groove 62 by means of electroplating, plasma enhanced chemical vapor deposition or sputtering. It should be noted that when the metal material is deposited in the via-hole 61, the deposition thickness may be set according to actual needs. For example, the deposited metal material may be filled up the via-hole 61 or may be only in a certain range in the vicinity of the side wall of the via-hole.

Finally, a laser or a cutter wheel may be employed to cut the base-substrate motherboard 6 along the preset cutting line 63 in the base-substrate motherboard 6 to form a plurality of separate circuit substrates. It should be noted that it is better to select a high-precision laser device for cutting. At present, some mainstream laser cutting devices can achieve glass cutting with an accuracy within 10 microns. Further, during the process of cutting, the depth of the formed groove 62 may be controlled by adjusting a cutting width. For example, the depth of the groove 62 after the cutting may be controlled to be about 40 μm to 90 μm.

In practical applications, the circuit substrate manufactured by the method provided in the embodiment of the present disclosure may include micro light emitting diodes 4 on the top surface of the base substrate 65. The driving circuit is coupled with the micro light emitting diodes 4. The driving circuit is provided with a control signal through the signal lines 60 and the signal-line leads, so that the driving circuit can generate a driving signal capable of driving the micro light emitting diodes 4, thereby driving the micro light emitting diodes 4 to emit light.

When manufacturing the circuit substrate according to the method provided in the embodiment of the present disclosure, the via-holes 61 are first formed in the preset cutting line 63 in the base-substrate motherboard 6; then, the conductive connection portion 64 is formed in the via-hole 61 with the conductive connection portion 64 connecting the signal line 60 on the top surface of the base-substrate motherboard 6 with the signal-line lead on the bottom surface of the base-substrate motherboard 6; and then the base-substrate motherboard 6 is cut along the cutting line 63 to form a plurality of separate circuit substrates. In the formed circuit substrate, a plurality of grooves 62 is defined in a lateral side of the base substrate 65, and extends through a top surface and a bottom surface of the base substrate 65. A conductive connection portion 64 is disposed in the groove 62. The presence of the conductive connection portion 64 can connect the signal line 60 on the top surface of the base substrate 65 with the signal-line lead on the bottom surface of the base substrate 65, thereby achieving signal transmission between the signal line 60 and the signal-line lead. It can be seen that when manufacturing the circuit substrate according to the method provided in the embodiment of the present disclosure, no via-hole is defined in an inside area of the base substrate 65, and thus the type of the selected base substrate 65 is not limited by the processing performance. For example, a glass substrate or a polyimide substrate may be selected. Further, the conductive connection portion 64 which connects the signal line 60 with the signal-line lead, is disposed in the groove 62 in the lateral side of the base substrate 65, thus, even if relative movement between circuit substrates occur in the process of splicing the circuit substrates, there is no friction between the conductive connection portions 64 located in the corresponding grooves 62 of different circuit substrates, thereby preventing damage to the conductive connection portions 64.

It can be seen that in the circuit substrate manufactured according to the method provided in the embodiment of the present disclosure, when the base substrate 65 employs the glass substrate, an active driving scheme may be realized when the driving circuit is formed on the glass substrate due to high flatness of the glass substrate, thereby reducing overall volume of the circuit substrate and further reducing power consumption of the circuit substrate. Further, the circuit substrate made of the glass substrate has good resistance to water and oxygen corrosion, thereby improving service life and reliability of the circuit substrate. Therefore, when the circuit substrate is used for preparing a backlight substrate or a display substrate of the Micro LED or the mini LED, the resolution of the backlight substrate or the display substrate of the Micro LED or the mini LED can be better satisfied.

In summary, in the circuit substrate manufactured according to the method provided in the embodiment of the present disclosure, when the glass substrate is used as a base substrate, in addition to the beneficial effects brought by the glass substrate, no via-hole is defined in an inner area of the glass substrate, thereby overcoming problem that the glass substrate is easy to be broken and cracked in the process of drilling holes with high precision due to the poor processing performance of the glass substrate. Further, when manufacturing the circuit substrate according to the method provided in the embodiment of the present disclosure, since formation of the conductive connection portion 64 in the via-hole 61 is prior to cutting the via-hole 61 along the cutting line 63, it can avoid the problem that the technical means of directly forming the conductive connection portion 64 on the lateral side of the base substrate 65 is immature.

In some embodiments, the step of fabricating a driving circuit on the base-substrate motherboard 6 in the above embodiment further includes: fabricating a thin film transistor array layer on the top surface of the base-substrate motherboard 6. The signal line 60 and the signal-line lead are used to provide corresponding control signals for the thin film transistor array layer, so that output electrodes of various thin film transistors included in the thin film transistor array layer output driving signals.

Specifically, the fabricated thin film transistor array layer may specifically include a light shielding layer, an active layer, a gate insulating layer, a gate, a dielectric layer, a source, a drain, a planarization layer and an anode. The active layer, the gate insulating layer, the gate, the dielectric layer, the source and the drain form a thin film transistor. The source or the drain may serve as an output electrode of the thin film transistor, and may be connected with the anode through a via-hole in the planarization layer. The anode may be used as a bonding pad for subsequent mounting of the Micro LED or the mini LED. The thin film transistor array layer may further include a common electrode. The common electrode may serve as another bonding pad for subsequent mounting of the Micro LED or the mini LED. It should be noted that when fabricating the thin film transistor array layer, it is necessary to reserve bonding pads of sufficient height and size for subsequent mounting of the Micro LED or the mini LED.

When fabricating the thin film transistor array layer of the above structure, the signal line 60 and the signal-line lead may be used to provide a corresponding control signal for the thin film transistor array layer. When the signal line 60 is connected with the gate included in the thin film transistor array layer, the signal line 60 is used to provide a scanning signal for the gate. When the signal line 60 is connected with the source or the drain which is included in the thin film transistor array layer and is not used as an output electrode, the signal line 60 is used to provide a data signal for the source or the drain.

When fabricating the thin film transistor array layer, the signal line 60 and the signal-line lead, a process flow commonly used in the related art may be employed, and the process flow may be the same as the process flow of the low temperature polysilicon driving circuit with high carrier mobility in an array substrate included in a current liquid crystal display device. Thus, when manufacturing the circuit substrate according to the method provided in the embodiment of the present disclosure, the thin film transistor array layer fabrication process in the production line of the related art can be compatible, and the manufacturing cost of the circuit substrate is greatly reduced.

In some embodiments, the step of fabricating a conductive connection portion 64 at an inner circumferential wall of each via-hole 61 in the cutting line 63 in the above embodiment further includes: fabricating a first part of the conductive connection portion 64 in the groove 62, with a maximum thickness of the first part less than a radius of the groove 62; fabricating a second part of the conductive connection portion 64 on the top surface of the base substrate 65, with the second part being connected with the first part; and, fabricating a third part of the conductive connection portion 64 on the bottom surface of the base substrate 65, with the third part being connected with the first part.

Specifically, when fabricating the above conductive connection portion 64, the first part of the conductive connection portion 64 may be fabricated in the via-hole 61; the second part may be fabricated on the top surface of the base substrate 65 with the second part being connected with the first part; and the third part may be fabricated on the bottom surface of the base substrate 65 with the third part being connected with the first part. The thickness of the first part, the second part and the third part may be set according to actual needs. For example, the thickness of the second part in the direction perpendicular to the base substrate 65, the thickness of the third part in the direction perpendicular to the base substrate 65, and the thickness of the first part in a direction perpendicular to a bottom of the groove 62, are equal to each other. Or, the thickness of the second part in the direction perpendicular to the base substrate 65 is equal to the thickness of the third part in the direction perpendicular to the base substrate 65, and the thickness of the second part in the direction perpendicular to the base substrate 65 is greater than the thickness of the first part in the direction perpendicular to the bottom of the groove 62.

In addition, the maximum thickness of the first part in the direction parallel to the base substrate 65 may set to be less than the radius of the via-hole 61, and this enables the first part to be better attached within the grooves, thereby further reducing the risk of easy separation of the first part of the conductive connection portion 64 and the glass substrate as the temperature changes due to different linear thermal expansion coefficients of the conductive connection portion 64 and the glass substrate, and then ensuring the reliability of the circuit substrate in practical application. When the maximum thickness of the first part in the direction parallel to the base substrate 65 is set to be equal to the maximum depth of the groove 62 formed by cutting the via-hole 61, the first part has a larger size, which not only improves signal transmission performance of the first part, but also better ensure connection between the first part and the second part, and between the first part and the third part.

The conductive connection portion 64 manufactured according to the method provided in the above embodiment includes the first part, the second part, and the third part, so that the conductive connection portion 64 may be connected with the signal line 60 through the second part, and may be connected with the signal-line lead through the third part. Since the second part and the signal line 60 are both on the top surface of the base substrate 65 and the third part and the signal-line lead are both on the bottom surface of the base substrate 65, better connection can be provided between the signal line 60 and the second part, and between the signal-line lead and the third part. In this way, in practical applications, it is not easy to break between the signal line 60 and the conductive connection portion 64, and between the signal-line lead and the conductive connection portion 64.

Figures 11, 12A:
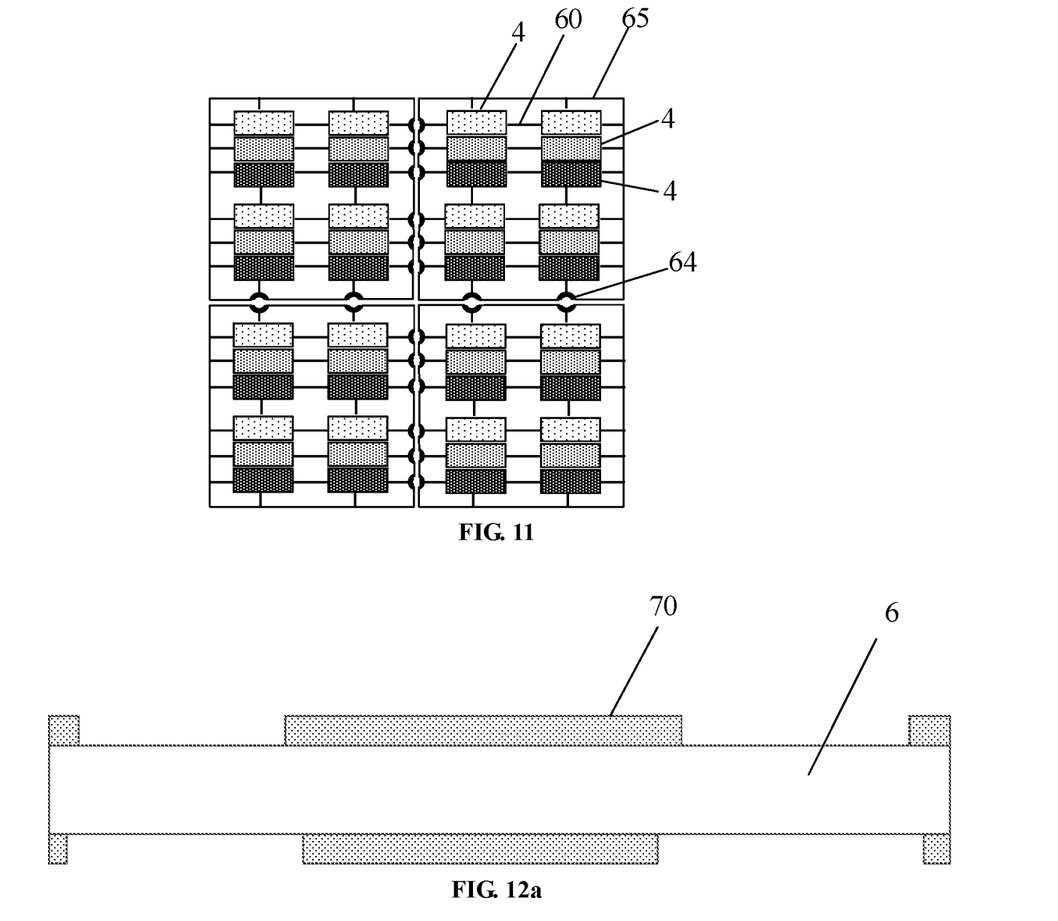
FIG. 11 is a schematic view of mounting micro light emitting diodes on various circuit substrates according to an embodiment of the present disclosure.
FIGS. 12a-12d are schematic flowcharts of forming a conductive connection portion according to an embodiment of the present disclosure.
Figure 12B:
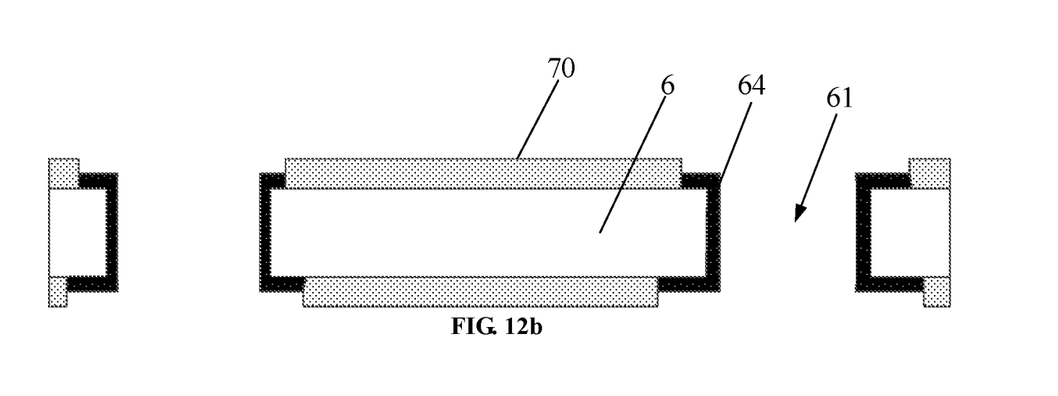
Figure 12C:
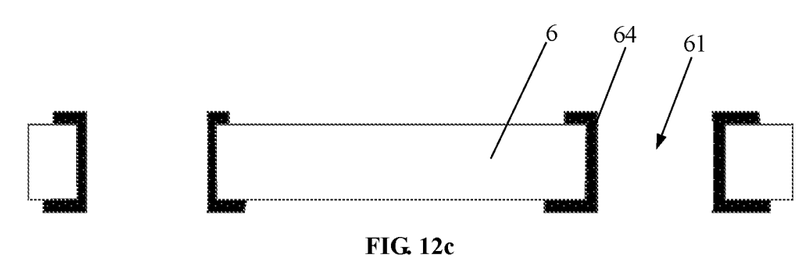

As shown in FIG. 12a to FIG. 12d, in some embodiments, the step of fabricating a conductive connection portion 64 at an inner circumferential wall of each via-hole 61 in the cutting line 63 in the above embodiment further includes:

forming a photoresist film 70 completely covering the base-substrate motherboard 6;

patterning the photoresist film 70 to form a photoresist reserved region and a photoresist removal region; where the photoresist removal region corresponds to a region where each conductive connection portion 64 is located (i.e., a region where each via-hole 61 in the cutting line 63 is located), and the photoresist reserved region corresponds to other region except for the region where each conductive connection portion 64 is located;

depositing a conductive material in the photoresist removal region; and removing the photoresist film 70 in the photoresist reserved region, thereby forming the conductive connection portion 64 at the inner circumferential wall of each via-hole 61 in the cutting line 63.

Specifically, the photoresist film 70 completely covering the base-substrate motherboard 6 may be formed first, and then the photoresist film 70 is exposed with a mask to form the photoresist reserved region and the photoresist removal region. The photoresist removal region corresponds to a region where each conductive connection portion 64 is located, and the photoresist reserved region corresponds to other region except for the region where each conductive connection portion 64 is located. Then, the photoresist film 70 in the photoresist reserved region is removed with a developing liquid. Subsequently, the conductive material is deposited in the photoresist removal region to form the conductive connection portion 64. Finally, the photoresist film 70 in the photoresist reserved region is removed to complete fabrication of the conductive connection portion 64 at the inner circumferential wall of each via-hole 61 in the cutting line 63.

Figure 12D:
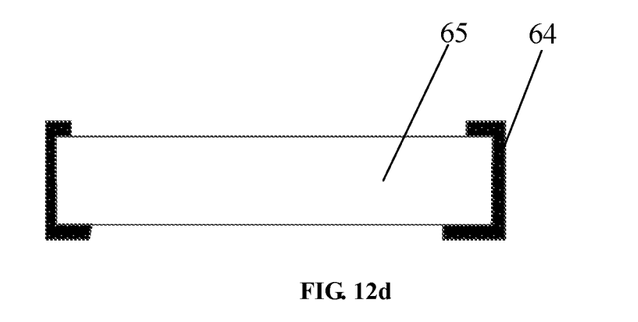

After that, the base-substrate motherboard 6 in which the conductive connection portion 64 is fabricated, is cut along the cutting line 63, with each via-hole 61 in the cutting line 63 being divided into two grooves. The conductive connection portion 64 in each via-hole 61 is divided into two portions which are in the two grooves respectively, as shown in FIG. 12d.

Figure 13A:
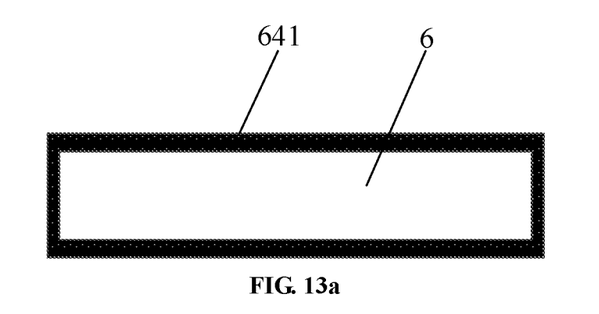
FIGS. 13a-13e are schematic flowcharts of forming a conductive connection portion according to another embodiment of the present disclosure.
Figure 13B:
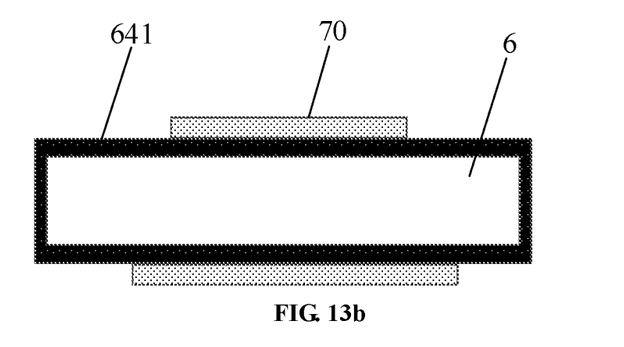
Figure 13C:
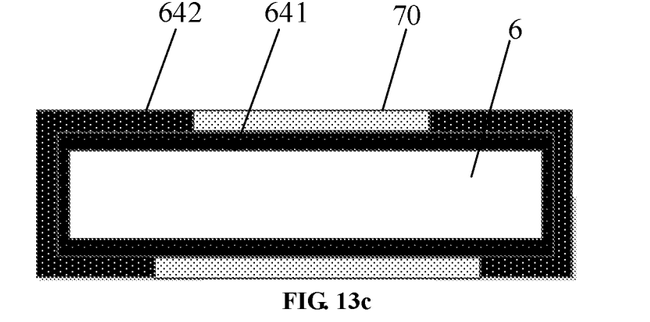
Figure 13D:
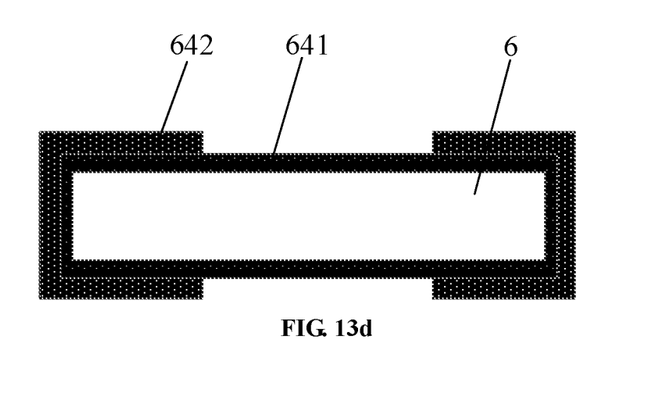
Figure 13E:
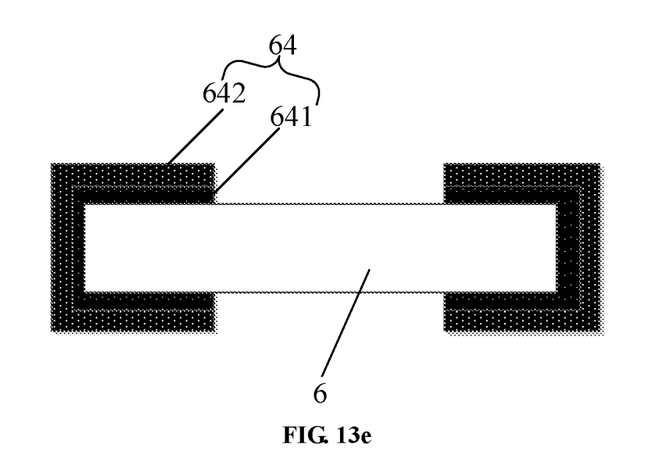

As shown in FIG. 13a to FIG. 13e, in some embodiments, the step of fabricating a conductive connection portion 64 at an inner circumferential wall of each via-hole 61 in the cutting line 63 in the above embodiment further includes:

forming a first conductive material layer 641 completely covering the base-substrate motherboard 6;

forming a photoresist film 70 completely covering the first conductive material layer 641;

patterning the photoresist film 70 to form a photoresist reserved region and a photoresist removal region; where the photoresist removal region corresponds to a region where each conductive connection portion 64 is located (i.e., a region where each via-hole 61 in the cutting line 63 is located), and the photoresist reserved region corresponds to other region except for the region where each conductive connection portion 64 is located;

forming a second conductive material layer 642 in the photoresist removal region;

removing the photoresist film 70 in the photoresist reserved region; and, removing the first conductive material layer 641 in the photoresist reserved region, thereby fabricating the conductive connection portion 64 at the inner circumferential wall of each via-hole 61 in the cutting line 63.

Specifically, the first conductive material layer 641 completely covering the base-substrate motherboard 6 may be first deposited, then the photoresist film 70 is formed on the first conductive material layer 641 with the photoresist film 70 completely covering the first conductive material layer 641. The photoresist film 70 is exposed with a mask to form the photoresist reserved region and the photoresist removal region. The photoresist removal region corresponds to a region where each conductive connection portion 64 is located, and the photoresist reserved region corresponds to other region except for the region where each conductive connection portion 64 is located. Then, the photoresist film 70 in the photoresist reserved region is removed with a developing liquid. Then, the second conductive material layer 642 is deposited in the photoresist removal region. Finally, the photoresist film 70 in the photoresist reserved region is peeled off, and the first conductive material layer 641 in the photoresist reserved region is removed by an etching process. In this way, the remaining first conductive material layer 641 and the second conductive material layer 642 together form the conductive connection portion 64 at the inner circumferential wall of each via-hole 61 in the cutting line 63. It should be noted that when removing the first conductive material layer 641 in the photoresist reserved region, a portion of the second conductive material layer 642 in the groove 62 may also be removed to adjust the maximum thickness of the conductive connection portion 64 in the direction parallel to the base substrate.

It should be noted that the photoresist film 70 in the above embodiment may employ a dry film photoresist, so that the photoresist can be uniformly formed on the first conductive material layer 641, thereby avoiding excessive flow of the photoresist into the via-hole 61.

In addition, in addition to forming the photoresist reserved region and the photoresist removal region in the above manner, a patterned dry film photoresist may be directly applied to the photoresist reserved region. The patterned dry film photoresist matches the photoresist reserved area.

It should be noted that the various embodiments described in the present specification are progressively presented. The description for each embodiment is focused on the difference from other embodiments. The description for the same or similar parts of these embodiments may be referred between embodiments. In particular, for the method embodiment, since it is basically similar to the product embodiment, the description for the method embodiment is relatively simple, and the relevant parts can be referred to the description of the product embodiment.

Unless otherwise defined, any technical or scientific terms used herein shall have the common meaning understood by a person of ordinary skills. Such words as "first" and "second" used in the specification are merely used to differentiate different components rather than to represent any order, number or importance. Such words as "comprise" or "comprising" means that an element or an object preceding the word includes an element or an object listed after the word and its equivalent, without excluding other elements or objects. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It should be understood that when an element such as a layer, a film, a region or a substrate is referred to as being "on" or "under" another element, the element may be "directly" "on" or "under" the another element, or there may be an intermediate component.

In the description of the above embodiments, specific features, structures, materials or characteristics may be combined in any suitable manner in any one or more embodiments or examples.

The above are merely the preferred embodiments of the present disclosure and shall not be used to limit the scope of the present disclosure. A person skilled in the art may make improvements and modifications without departing from the principle of the present disclosure, and these improvements and modifications shall also fall within the scope of the present disclosure. Therefore, the protection scope of the present disclosure should be determined by the scope of the appended claims.

What is claimed is:

1. A circuit substrate, comprising:
a base substrate;
a driving circuit on the base substrate; and
a plurality of conductive connection portions;
wherein a plurality of grooves is defined in a lateral side of the base substrate; each of the plurality of grooves extends through a top surface and an opposite bottom surface of the base substrate;
in the lateral side of the base substrate, the plurality of separate grooves are separate from each other;
the driving circuit includes signal lines on the top surface of the base substrate and signal-line leads on the bottom surface of the base substrate; and
the plurality of conductive connection portions are corresponding to the plurality of grooves in a one-to-one manner; at least one part of each of the plurality of conductive connection are portions in a corresponding one of the plurality of grooves; and each of the plurality of conductive connection portions are connected with a corresponding one of the signal lines and a corresponding one of the signal-line leads, respectively;
wherein each of the plurality of grooves is recessed from the lateral side of the base substrate toward an inner side of the base substrate.

2. The circuit substrate according to claim 1, wherein each of the plurality of grooves extends in a direction perpendicular to the base substrate.

3. The circuit substrate according to claim 2, wherein each of the plurality of conductive connection portions include:
a first part in the corresponding one of the plurality of grooves, a second part connected with the first part and located on the top surface of the base substrate, and a third part connected with the first part and located on the bottom surface of the base substrate; the second part is connected with the corresponding one of the signal lines, and the third part is connected with the corresponding one of the signal-line leads.

4. The circuit substrate according to claim 3, wherein in a direction parallel to the base substrate, a maximum thickness of the first part is less than or equal to a maximum depth of the corresponding one of the plurality of grooves.

5. The circuit substrate according to claim 3, wherein a shape of a cross section of the corresponding one of the plurality of grooves in a plane substantially parallel to the top surface of the base substrate is C shaped.

6. The circuit substrate according to claim 3, wherein a shape of a cross section of the corresponding one of the plurality of grooves in a plane substantially parallel to the top surface of the base substrate is semi-circular.

7. The circuit substrate according to claim 1, wherein the driving circuit further includes a thin film transistor array layer on the top surface of the base substrate; and the signal lines and the signal-line leads configured to provide control signals for the thin film transistor array layer.

8. The circuit substrate according to claim 1, wherein the base substrate is a glass substrate or a polyimide substrate.

9. A method for manufacturing the circuit substrate according to claim 1, comprising:
providing a base-substrate motherboard;
fabricating the driving circuit on the base-substrate motherboard, wherein the driving circuit includes signal lines on a top surface of the base-substrate motherboard and signal-line leads on an opposite bottom surface of the base-substrate motherboard;
fabricating a plurality of via-holes extending through the base-substrate motherboard; wherein each of the plurality of via-holes is in a preset cutting line;
fabricating the each of the plurality of conductive connection portions at an inner circumferential wall of each of the plurality of via-holes; wherein the each of the plurality of conductive connection portions are connected with the corresponding one of the signal lines and the corresponding one of the signal-line leads, respectively; and
cutting the base-substrate motherboard in which the each of the plurality of conductive connection portions are fabricated, along the cutting line, thereby forming a plurality of separate circuit substrates.

10. The method according to claim 9, wherein the step of fabricating the driving circuit on the base-substrate motherboard, further includes:
fabricating a thin film transistor array layer on the top surface of the base-substrate motherboard; wherein the signal lines and the signal-line leads are configured to provide control signals for the thin film transistor array layer, thereby enabling output electrodes of thin film transistors included in the thin film transistor array layer to output driving signals.

11. The method according to claim 9, wherein the step of fabricating the each of the plurality of conductive connection portions at the inner circumferential wall of each of the plurality of via-holes, include:
forming a photoresist film completely covering the base-substrate motherboard;
patterning the photoresist film to form a photoresist reserved region and a photoresist removal region;
wherein the photoresist removal region corresponds to a region where the each of the plurality of conductive connection portions are located, and the photoresist reserved region corresponds to other region except for the region where the conductive connection portion is located;
depositing a conductive material in the photoresist removal region; and
removing the photoresist film in the photoresist reserved region, thereby forming the each of the plurality of conductive connection portions at the inner circumferential wall of each of the plurality of via-holes.

12. The method according to claim 9, wherein the step of fabricating the each of the plurality of conductive connection portions at the inner circumferential wall of each of the plurality of via-holes, include:
    forming a first conductive material layer completely covering the base-substrate motherboard;
    forming a photoresist film completely covering the first conductive material layer;
    patterning the photoresist film to form a photoresist reserved region and a photoresist removal region;
    wherein the photoresist removal region corresponds to a region where the each of the plurality of conductive connection portions are located, and the photoresist reserved region corresponds to other region except for the region where the each of the plurality of conductive connection portions are located;
    forming a second conductive material layer in the photoresist removal region;
    removing the photoresist film in the photoresist reserved region; and,
    removing the first conductive material layer in the photoresist reserved region, thereby forming the each of the plurality of conductive connection portions at the inner circumferential wall of each of the plurality of via-holes.

13. The method according to claim 9, wherein in the step of cutting the base-substrate motherboard in which the each of the plurality of conductive connection portions are fabricated, along the cutting line, each of the plurality of via-holes in the preset cutting line is divided into two grooves.

14. The method according to claim 13, wherein a shape of a cross section of each of the plurality of grooves in a plane substantially parallel to the top surface of the base substrate is C shaped.

15. The method according to claim 13, wherein a shape of a cross section of each of the plurality of grooves in a plane substantially parallel to the top surface of the base substrate is semi-circular.

16. A display substrate, comprising:
    a circuit substrate; and
    a plurality of micro light emitting diodes on the circuit substrate;
    wherein the circuit substrate is configured to drive the plurality of micro light emitting diodes to emit light; and the circuit substrate includes:
    a base substrate;
    a driving circuit on the base substrate and coupled with the plurality of micro light emitting diodes; and
    a plurality of conductive connection portions;
    wherein a plurality of grooves is defined in a lateral side of the base substrate;
    each of the plurality of grooves extends through a top surface and an opposite bottom surface of the base substrate;
    in the lateral side of the base substrate, the plurality of separate grooves are separate from each other;
    the driving circuit includes signal lines on the top surface of the base substrate and signal-line leads on the bottom surface of the base substrate; and
    the plurality of conductive connection portions are corresponding to the plurality of grooves in a one-to-one manner; at least one part of each of the plurality of conductive connection portions are in a corresponding one of the plurality of grooves; and each of the plurality of conductive connection portions are connected with a corresponding one of the signal lines and a corresponding one of the signal-line leads, respectively;
    wherein each of the plurality of grooves is recessed from the lateral side of the base substrate toward an inner side of the base substrate.

17. A tiled display device comprising: a plurality of connected display substrates according to claim 16.

* * * * *